United States Patent [19]

Hochberg et al.

[11] Patent Number: 4,992,299

[45] Date of Patent: Feb. 12, 1991

[54] DEPOSITION OF SILICON NITRIDE FILMS FROM AZIDOSILANE SOURCES

[75] Inventors: Arthur K. Hochberg, Solana Beach; David L. O'Meara, Oceanside; David A. Roberts, Carlsbad, all of Calif.

[73] Assignee: Air Products and Chemicals, Inc., Allentown, Pa.

[21] Appl. No.: 473,300

[22] Filed: Feb. 1, 1990

[51] Int. Cl.⁵ .............................................. B05D 3/06
[52] U.S. Cl. .................................... 427/38; 427/53.1; 427/248.1; 427/255; 427/255.1
[58] Field of Search ............... 427/38, 53.1, 248.1, 427/255, 255.1

[56] References Cited

U.S. PATENT DOCUMENTS 4,863,755  9/1989  Heoo et al. ............................ 427/51

Primary Examiner—Stanley Silverman
Attorney, Agent, or Firm—James C. Simmons

[57] ABSTRACT

A method of producing a silicon nitride film on the surface of a substrate by thermal decomposition at said surface of a compound of the class

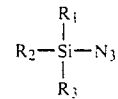

wherein $R_1$, $R_2$, and $R_3$ are hydrogen azido, 1 to 6 carbon alkyl, phenyl, or 7 to 10 carbon alkaryl, at least one of $R_1$, $R_2$, and $R_3$ being 1-6 carbon alkyl, phenyl, or 7 to 10 carbon alkaryl, ethyltriazidosilane being uniquely superior, is disclosed.

24 Claims, No Drawings

DEPOSITION OF SILICON NITRIDE FILMS FROM AZIDOSILANE SOURCES

FIELD OF THE INVENTION

This invention relates to the formation of thin inorganic films, with particular application to the formation of thin silicon nitride films in the manufacture of semiconductor devices.

BACKGROUND OF THE INVENTION

It is standard practice in the manufacture of many semiconductor devices, and other devices, to provide a thin passive layer or coating of a chemically nonreactive or low reactivity material to protect the semiconductor junctions and layers from degradation by contact with oxygen, fumes in the air, moisture, etc., and from damage by contact during packaging and handling.

The production of silicon oxide and silicon nitride coatings application to semiconductor devices and to other devices is well known, and there is considerable literature on the subject. The general principles underlying the formation of thin films are described in HANDBOOK OF THIN FILM TECHNOLOGY, Maissell, Leon I. and Glang, Reinhard, editors, McGraw Hill Book Company, New York, 1970, and the general technology for processing silicon-based semiconductor devices in described in SILICON PROCESSING FOR THE VLSI ERA, Wolf, Stanley, and Talbert, Richard N., editors, Lattice Press, Sunset Beach, Calif., 1986, which includes a discussion of thin film technology.

Silicon dioxide is commonly used as a film-forming material to protect semiconductor devices. Thermally grown films of silicon nitride, $Si_3N_4$, however, have a number of advantages over silicon dioxide. For example, silicon nitride films tend to have self-limiting growth kinetics, and therefore their thickness is easily controllable. In addition, silicon nitrides are effective barriers to moisture, oxygen and sodium and other gas and chemical diffusion. MOS devices fabricated with silicon nitride films show large values of gain and reduced hot electron effects.

Silicon nitride films are amorphous insulating materials and serve as final passivation and mechanical protective layers for integrated circuits, as a mask for selective oxidation of silicon, and as a gate for MNOS devices. Silicon nitride is known to have a high dielectric constant and a low compressive stress and can be deposited with low pinhole densities.

Thermal silicon nitride films are generally grown by the high temperature nitridation of silicon in pure ammonia or an ammonia plasma. Silicon nitride films can also be prepared by plasma anodic nitridation using a nitrogen-hydrogen plasma. The thermal nitridation of silicon dioxide films results in the formation of a nitrided-oxide or a nitro-oxide film, the composition of which is found to vary considerably with the depth of the film.

Two techniques are most generally used to deposit silicon nitride, namely the low pressure chemical vapor deposition (LPCVD) process and the plasma enhanced chemical vapor deposition (PECVD) process. These processes are described in SILICON PROCESSING, supra, Chapter 6. Very briefly, the LPCVD process is typically carried out at from about 0.25–2.0 Torr and at temperatures of 700° C to about 825° C. The PECVD METHOD relies substantially solely on thermal energy to initiate and sustain chemical reaction, using a radio frequency (rf) induced glow discharge to transfer energy into the reactant gases, allowing the substrate to remain at a lower temperature than is the case in the LPCVD, and the less used atmospheric pressure chemical vapor (APCVD) processes. The plasma (which is more correctly described as a glow discharge) is generated by the rf field creating free electrons which collide with the gas molecules, causing gas-phase dissociation and ionization of the reactant gasses. Upon being adsorbed on the substrate, the film precursor is bombarded by electrons and ions and are further dissociated and rearranged until, ultimately, a film consisting essentially of silicon nitride results.

The production of silicon nitride films by the reaction of silane, $SiH_4$, ammonia and hydrogen is quite well known. The analogous reaction of alkylsilanes is also known. For example, Great Britain Patent No. 1,146,383 describes the production of silicon nitride films by the reaction of trimethylsilane in ammonia, East German Patent No. DD 90,185, describes the production of a silicon nitride passivation layer by the vapor phase reaction of trimethylsilane, and Fischer, Z. Phys. Chem. (Leipzig), V. 255, N. 4, pp. 773–86 (1974) describes the hydrolysis of methylsilane and the reaction with ammonia. There are a number of patents and publications which describe variations of this technique involving the vapor phase reaction of tetramethylsilane with ammonia, or comparable silane-amine compounds.

Nelson, U.S. Pat. No. 4,158,717 reviews the state of the art of producing silicon nitride films and describes the production silicon nitride films as protective and anti-reflective coatings and for masking semiconductive devices by a plasma discharge in azidotrimethylsilane, $(CH_3)_3SiN_3$, pointing out that azidotrimethylsilane is easier to handle than silane.

Matsuda et al, U.S. Pat. No. 4,569,855, discloses the use of azidosilanes in a very low temperature (50°–150° C) high energy light activated gas deposition process for forming silicon and doped silicon films. While reference is made to alkyl, aryl and alkoxy azidosilanes, there is no specific disclosure of the use of ethyl, propyl, or butyl azidosilanes, or to higher-carbon alkyl, aryl or alkoxy azidosilanes in the Matsuda et al patent. Since the greater part of the Matsuda et al process activation energy for decomposing the gas to form a film comes from very high energy light photons, e.g. U.V., X-ray or gamma photons, it would not be possible to predict from Matsuda et al what may result from the use of higher-carbon azidosilanes in a thermal-activation method at higher temperatures. Matsuda further states that only some silicon deposition would result from a thermal decomposition process.

Silicon nitride-silicon oxide films are produced by the gaseous reaction of alkylsilane or arylsilane with ammonia or a volatile amine and a gaseous hydrocarbon such as methane, propane, etc. according to a process described by Bogh and Mirbach, U.S. Pat. No. 4,091,169.

There are also a number of processes described involving production of silicon nitride or silicon nitride-containing films, fibers or structures using a variety of silicon-containing compounds such as polycarbosilanes, siloxanes, etc., e.g. European Patent Application No. EP167230 A2, Jan. 8, 1986.

Plasma-deposited silicon nitride films from hexamethyldisilazane have been described by Janca, J. et al., Scr. Fac. Sci. Nat. Univ. Purkynianaebrun., V. 14, N. 1-2, pp. 27-33 (1984). Silicon nitrides have also been produced from polysilazanes, U.S. Pat. No. 4,612,383, Laine, Richard N., Sept. 16, 1986 and by the reaction of trichloromethylsilane in the presence of nitrates, Japanese Patent Application No. 78464733, Apr. 21, 1978, Indo, Hiroshi, et al.

Polymethylsiloxane nitridation has also been carried out to produce silicon nitride, Japanese Patent No. 7993699, July 24, 1979, Motoi, Soichiro.

Azidosilanes, the characteristics and preparation thereof, have been described; see, for example, Wiberg, Int. Symp. Organosilicon Chem., Sci. Commun., pp. 232-35, 1965; Liu, Sheng-Lieh, et al., J. Chin. Chem. Soc. (Taipei), V. 17, N. 4, pp. 229-34 (1970); Wiberg, Nils, et al., J. Organometal. Chem., V. 22, N. 2, pp. 349-56 (1970).

As mentioned, it is known to produce silicon nitride films from azidosilanes under severe reaction conditions such as occur in a plasma discharge such as described, for example, by Nelson, supra. A glow discharge is a self-sustaining type of plasma, i.e. a partially ionized gas containing an equal number of positive and negative ions, as well as some non-ionized gas particles. A glow discharge is created by the application of a voltage differential between the material with respect to which the glow discharge is applicable and another electrode. Nelson utilizes the well-known technique of using high frequencies, e.g. 13 MHz, for applying high voltages and enhancing plasma generation. As the voltage is increased, a point is reached in which gas breakdown occurs and there is current flow, vis-a-vis free electrons and gas ions, between the two electrodes. Each new ionization event takes place closer to the positively charged anode, as the electrons are accelerated toward and in collision with the anode. When a sufficient number of electrons are available to maintain the discharge, the discharge becomes self-sustaining. Substantially all of the energy is applied to the source, and the ions created at the source by the application of the energy simply impinge upon the surface of the material to be coated. This phenomena is extremely important where the substrate upon which the film is to be deposited cannot be heated to very high temperatures. Nelson, supra, points out that the substrate can be at room temperature, though higher temperatures result in superior films.

An inherent characteristic of the glow discharge method, where the source is other than a single element, is the creation of a large number of ionized and non-ionized fragments of the source. Thus, plasma discharge operations differ very significantly from the thermal process. For example, it is well known that the thermal TEOS deposition takes place at temperatures in excess 650° C, even in the absence of oxygen. A plasma TEOS film deposition, on the other hand, occurs at temperatures below 350° C in the presence of oxygen but does not produce a pure silicon dioxide. The film also contains significant amounts of hydrogen and is also contaminated with organic polymer residues. These carbonaceous impurities are only eliminated in a plasma/ozone process at temperatures around 400° C minimum in the presence of excess oxygen.

SUMMARY OF THE INVENTION

The present invention comprises a method for producing silicon nitride films by deposition using azidosilanes. The reaction is carried out, typically, in an oxygen-free environment at a temperature in the range of from as low as 400° C, or lower, to 600° C, or higher in some instances, and in the pressure range of from about 0.1 torr 1.9 torr, or even at atmospheric pressure.

One of the features of this invention is that relatively low vapor pressure liquid chemicals replace compressed gases such as the silanes and halosilanes which are currently utilzed in nitride processes.

Another feature of the invention is the avoidance of the incorporation of hydrogen in silicon nitride films which results from plasma processes, such as described by Nelson, et al., supra.

Another advantage of the present invention is embodied in one of the preferred processes in which methyl and ethyl azidosilanes, preferably ethyl azidosilanes, are used to produce very high quality silicon nitride films.

The present invention in a preferred embodiment comprises the low pressure chemical vapor deposition (LPCVD) of passive coatings and films and layers of silicon nitride from azidosilanes (e.g. alkylazidosilanes, arylazidosilanes and alkarylazidosilanes) at temperatures of about 400° C to 600° C and pressures of about 0.1 to about 1 torr.

The invention involves the reaction of compounds of the class

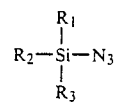

wherein $R_1$, $R_2$, and $R_3$ are hydrogen, azido, 1 to 6 carbon alkyl, phenyl, or 7 to 10 carbon aralkyl, at least one of $R_1$, $R_2$, and $R_3$ being 1 to 6 carbon alkyl, phenyl, or 7 to 10 carbon aralkyl, the preferred species being ethyltriazidosilane.

The methods of this invention may be used to deposit doped or undoped silicon nitride films.

DESCRIPTION OF THE PREFERRED EMBODIMENT

In the following description, specific examples are referred to as exemplary and illustrative and not as limiting of the invention.

The process of the present invention comprises the following steps, each and all of such steps being subject to considerable variation depending upon the substrate to be coated, the thickness and composition of the desired coating, etc.

First the substrate is placed in a suitable reaction chamber which, typically, may be a vacuum oven, i.e. an oven which can be evacuated to the desired pressure. The substrate may be of virtually any material and structure which will withstand the temperatures involved. A typical substrate is an integrated circuit silicon wafer, and this will be used as the illustrative substrate with the understanding that the nature, composition or construction of the substrate is not critical, provided the temperatures involved are not detrimental to the substrate structure or composition.

After evacuation and, if necessary, flushing with high purity hydrogen, nitrogen or an inert gas such as helium or argon to assure that the chemical vapor deposition reactor is free of oxygen and moisture, the substrate is heated to a temperature of from about 400° C to about 600° C. Evacuation continues during outgassing to maintain the pressure in the range of from about 0.1 to 1 torr. Once the desired temperature and pressure parameters are established and stable, very high purity alkyl- or aryl-azidosilane is introduced, either at the indicated pressures of from about 0.1 to 1 torr or at pressures as high as atmospheric, maintaining an inert, moisture and oxygen free environment in the reactor. The rate of introduction of the azidosilane and the evacuation rates are controlled to maintain the pressure in the 0.1 to 1 torr range while the reaction takes place. Source feed rates of from about 0.05 to 1 gm/min, preferably in the range of from about 0.15 to 0.5 gm/min are generally suitable.

Deposition rate is dependent upon the temperature, pressure and feed rate of the azidosilane, and upon the particular azidosilane being used. Deposition rates of greater than 100 Å/min can be achieved at 500° C and a source flow of up to 0.2 gm/min of ethyltriazidosilane.

The compounds which are considered useful in this process are of the class

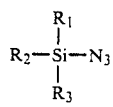

wherein $R_1$, $R_2$, and $R_3$ are hydrogen, azido, 1 to 6 carbon alkyl, phenyl, or 7 to 10 carbon alkaryl, at least one of $R_1$, $R_2$, and $R_3$ being 1-6 carbon alkyl, phenyl, or 7 to 10 carbon alkaryl.

In a preferred subclass within said class $R_1$, $R_2$, and $R_3$ are 1 to 4 carbon alkyl or phenyl.

There was considerable doubt, at the outset, that a coherent silicon nitride film could be produced by thermal deposition, wherein the reaction takes place totally or at least substantially at and in the immediate vicinity of the substrate surface, without the addition of a high energy source such as a glow or plasma discharge.

Once it was discovered that a film, as opposed to a smoke or particulate product or an amorphous powder, could be produced, it was an even greater surprise that one of the class of compounds referred to was strikingly superior to others with respect to the quality of the film which resulted. It was discovered that the species ethyltriazidosilane when used as the feed source produced exceptionally high quality films when compared with, for example, trimethylazidosilane.

While ethyltriazidosilane produces surprisingly high quality films of silicon nitride, other compounds may be used. Examples of compounds considered suitable for use in the present invention are R-azidosilane, R-diazidosilane, R-triazidosilane, di-R-azidosilane, di-R-diazidosilane, tri-R-azidosilane, where R is methyl, ethyl, propyl (n- and iso-), butyl (n-, iso, and tert-), phenyl, and tolyl.

The films resulting from this process are stronger, more coherent and more free of pinholes than films produced using a plasma. The superior films produced by this process are believed to result from the absence of hydrogen which is produced in large quantities in the plasma processes and which impinge upon the forming film during reaction. Whether or not this hypothesis is accurate, the films which are produced are of exceptionally high quality and integrity.

The films were subjected to infrared spectroanalysis and energy dispersive x-ray analysis to determine the composition and were compared with known silicon nitride films deposited by the more conventional silane-ammonia and dichlorosilane-ammonia processes referred to above. The infrared spectra of the films produced by this process showed strong absorption in the 800-850 cm$^{-1}$ wavenumber range, characteristic of Si-N stretching in $Si_3N_4$ films. Films produced by this process exhibited a refractive index of approximately 2.0 which is characteristic of $Si_3N_4$ films.

In a typical example, using the preferred compound, $(CH_3CH_2)Si(N_3)_3$, carrying out the process as described with a feed rate of 0.29 gm/min, a reactor pressure of 380 mTorr and a temperature of 515° C silicon nitride was deposited in a strong, coherent, homogeneous and adherent film at the rate of 90 Å/min.

In another test using the process of the invention, ethyltriazidosilane was fed at a rate of 0.14 gm/min at a reactor pressure of 500 mTorr and a temperature of 600° C resulting in deposition of silicon nitride at a rate of 173 Å/min.

In another example when diethyldiazidosilane was used in the process of the invention at 513° C, with a feed rate of 0.72 gm/min and reactor pressure of 500 mTorr, films were deposited at the rate of 58 Å/min.

In a second test of the process of the present invention, diethyldiazidosilane was fed into the reactor at a rate of 0.14 gm/min with a reactor pressure of 315 mTorr and a temperature of 600° C resulting in deposition of silicon nitride at a rate of 100 Å/min.

In yet another example when triethylazidosilane was used in the process of the invention at 550° C, with a feed rate of 0.7 gm/min and a reactor pressure of 850 mTorr, films were deposited at the rate of approximately 20 Å/min.

In a further test of the process of the present invention, triethylazidosilane was fed into the reactor at a rate of 0.3 gm/min with a reactor pressure of 300 mTorr and a temperature of 600° C resulting in a deposition of silicon nitride at a rate of 20 Å/min.

Tert-butyl triazidosilane was used in the process of the invention at 510° C, with a feed rate of 0.39 gm/min and reactor pressure of 400 mTorr to produce films that were deposited at the rate of 32 Å/min.

Tert-butyl triazidosilane was also used in the process of the present invention where the compound was fed to the reactor at a rate of 0.6 gm/min at a reactor pressure of 800 mTorr and a temperature of 450° C resulting in a deposition of silicon nitride at a rate of 50 Å/min. The films were closer to pure silicon nitride than in the previous example. The purity of the source material is critical. Oxygen-containing species at the 0.1% level prevent the attainment of pure silicon nitride films at these temperatures due to the higher reactivity of oxygen with silicon vs. nitrogen bonding to silicon.

Even after deposition, exposure of films to an ambient atmosphere resulted in various degrees of oxygen incorporation into the films. The oxygen incorporation decreases as the temperature of the films is decreased before exposure to oxygen. This was presumably related to the relative porosity of the films upon deposition. Likewise, the incorporation of varying amounts of carbon impurities into the films could result from impurities in the azidosilane source and deposition conditions, and in some cases seemed to be inherent to the particular azidosilane source.

Alkyl, aryl and aralkyl homologues of these compounds are considered to be generally equivalent, although it would be most surprising to discover any other species which would produce a film of the quality produced by - ethyltriazidosilane. Thus, the invention relates in a broader sense to the class of azidosilanes described and includes the most striking and surprising discovery that films formed using ethyltriazidosilane are much superior to any comparable films.

The films attained by LPCVD, described above, could also be deposited by other means. For atmospheric depositions, silicon nitride films could be obtained if the sources were diluted in ultra high purity gases such as helium, argon, and nitrogen in order to maintain the oxygen-free environment. Very high purity purge gases, with oxygen and water vapor below 1 ppm, must be used to prevent any air intrusion into the reactor area.

Silicon nitride films may be obtained by using these sources at reduced pressures with decomposition produced by ion, electron, or laser energy. Plasma assisted depositions may require the addition of hydrogen to eliminate incorporation of carbon in the films.

INDUSTRIAL APPLICATION

This invention is useful in the manufacture of semiconductor devices and other devices in which it is desirable to cover a surface with high integrity adherent silicon nitride films.

What is claimed is:

1. A method of producing a silicon nitride film on the surface of a substrate comprising the steps of heating the substrate surface to a temperature of from about 400° C to about 600° C in an oxygen-free environment in which the pressure is from about 0.1 torr to about atmospheric and introducing into said reactor a compound of the class

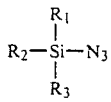

wherein $R_1$, $R_2$, and $R_3$ are hydrogen, azido, 1 to 6 carbon alkyl, phenyl, or 7 to 10 carbon aralkyl, at least one of $R_1$, $R_2$, and $R_3$ being 1–6 carbon alkyl, phenyl, or 7 to 10 carbon aralkyl.

2. The method of claim 1 wherein the compound is of the class introducing into said reactor a compound of said class wherein $R_1$, $R_2$, and $R_3$ are 1 to 6 carbon alkyl.

3. The method of claim 1 wherein the compound is ethyltriazidosilane.

4. The method of claim 1 wherein the compound is diethyldiazidosilane.

5. The method of claim 1 wherein the compound is triethylazidosilane.

6. The method of claim 1 wherein the compound is tert-butyltriazidosilane.

7. The method of claim 1 wherein the pressure in the reactor is maintained at less than atmospheric pressure and further comprising inducing decomposition of the azidosilane compound by ion, electron, or laser energy.

8. The method of claim 7 wherein the compound is of the class introducing into said reactor a compound of said class wherein $R_1$, $R_2$, and $R_3$ are 1 to 6 carbon alkyl.

9. The method of claim 7 wherein the compound is ethyltriazidosilane.

10. The method of claim 7 wherein the compound is diethyldiazidosilane.

11. The method of claim 7 wherein the compound is triethylazidosilane.

12. The method of claim 7 wherein the compound is tert-butyltriazidosilane.

13. The method of claim 1 wherein the pressure in the reactor is maintained at less than atmospheric pressure and further comprising inducing decomposition of the azidosilane compound by plasma inducing energy and introducing hydrogen into the reactor to eliminate incorporation of carbon in the films.

14. The method of claim 13 wherein the compound is of the class introducing into said reactor a compound of said class wherein $R_1$, $R_2$, and $R_3$ are 1 to 6 carbon alkyl.

15. The method of claim 13 wherein the compound is ethyltriazidosilane.

16. The method of claim 13 wherein the compound is diethyldiazidosilane.

17. The method of claim 13 wherein the compound is triethylazidosilane.

18. The method of claim 13 wherein the compound is tert-butyltriazidosilane.

19. A method of producing silicon nitride films on the surface of a substrate carrying the steps of heating the substrate surface to a temperature of from about 400° C to about 600° C in an oxygen-free environment in which the pressure in from about 0.1 torr to about 1 torr and introducing into said reactor a compound of the class

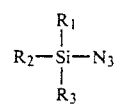

wherein $R_1$, $R_2$, and $R_3$ are hydrogen, azido, 1 to 6 carbon alkyl, phenyl, or 7 to 10 carbon aralkyl, at least one of $R_1$, $R_2$, and $R_3$ being 1 to 6 carbon alkyl, phenyl, or 7 to 10 carbon aralkyl.

20. The method of claim 19 wherein the compound is of the class introducing into said reactor a compound of said class wherein $R_1$, $R_2$, and $R_3$ are 1 to 6 carbon alkyl.

21. The method of claim 19 wherein the compound is ethyltriazidosilane.

22. The method of claim 19 wherein the compound is diethyldiazidosilane.

23. The method of claim 19 wherein the compound is triethylazidosilane.

24. The method of claim 19 wherein the compound is tert-butyltriazidosilane.

* * * * *